(12) United States Patent
Won et al.

(10) Patent No.: US 9,218,977 B2
(45) Date of Patent: Dec. 22, 2015

(54) FABRICATING METHOD OF A SEMICONDUCTOR DEVICE

(71) Applicant: SAMSUNG ELECTRONICS CO., LTD., Suwon-si, Gyeonggi-do (KR)

(72) Inventors: Seok-Jun Won, Seoul (KR); Weon-Hong Kim, Gyeonggi-do (KR); Moon-Kyun Song, Gyeonggi-do (KR); Hyung-Suk Jung, Gyeonggi-do (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/015,414

(22) Filed: Aug. 30, 2013

(65) Prior Publication Data

US 2014/0113443 A1 Apr. 24, 2014

(30) Foreign Application Priority Data

Oct. 23, 2012 (KR) ........................ 10-2012-0117831

(51) Int. Cl.
| | |
|---|---|
| H01L 21/3205 | (2006.01) |
| H01L 21/4763 | (2006.01) |
| H01L 21/28 | (2006.01) |
| H01L 29/51 | (2006.01) |
| H01L 21/8234 | (2006.01) |
| H01L 21/8238 | (2006.01) |
| H01L 29/49 | (2006.01) |
| H01L 29/66 | (2006.01) |
| H01L 27/11 | (2006.01) |

(52) U.S. Cl.
CPC .... *H01L 21/28185* (2013.01); *H01L 21/82345* (2013.01); *H01L 21/823842* (2013.01); *H01L 29/513* (2013.01); *H01L 29/517* (2013.01); *H01L 29/518* (2013.01); *H01L 27/1104* (2013.01); *H01L 29/4966* (2013.01); *H01L 29/66545* (2013.01)

(58) Field of Classification Search
CPC ............ H01L 29/517; H01L 21/28185; H01L 29/518; H01L 21/28202; H01L 29/66545; H01L 21/31645; H01L 21/02164; H01L 21/31641; H01L 21/02323; H01L 21/02329; H01L 21/823857; H01L 28/56; H01L 21/02181

See application file for complete search history.

(56) References Cited

U.S. PATENT DOCUMENTS

| | | | |
|---|---|---|---|
| 6,642,131 B2 | 11/2003 | Harada | |
| 6,753,556 B2 | 6/2004 | Cartier et al. | |
| 7,504,700 B2 * | 3/2009 | Zhu et al. ...................... | 257/410 |
| 7,723,767 B2 | 5/2010 | Li et al. | |
| 7,947,610 B2 | 5/2011 | Tsunashima et al. | |
| 8,035,173 B2 * | 10/2011 | Bu et al. ........................ | 257/410 |
| 8,049,304 B2 | 11/2011 | Srividya et al. | |
| 8,084,808 B2 | 12/2011 | Ahn et al. | |
| 8,110,473 B2 | 2/2012 | Kang et al. | |

(Continued)

FOREIGN PATENT DOCUMENTS

| | | |
|---|---|---|
| JP | 2011-014614 | 1/2011 |
| JP | 2011-238655 | 11/2011 |

(Continued)

*Primary Examiner* — Bac Au
(74) *Attorney, Agent, or Firm* — Lee & Morse, P.C.

(57) ABSTRACT

A fabricating method of a semiconductor device includes stacking a high-k dielectric film not containing silicon (Si) and an insulating film containing silicon (Si) on a substrate, and diffusing Si contained in the insulating film into the high-k dielectric film by annealing the substrate having the high-k dielectric film and the insulating film stacked thereon.

18 Claims, 10 Drawing Sheets

(56) References Cited

U.S. PATENT DOCUMENTS

| | | | |
|---|---|---|---|
| 8,154,091 B2 | 4/2012 | Dubourdieu et al. | |
| 8,319,271 B2 * | 11/2012 | Kikuchi et al. | 257/316 |
| 2003/0054669 A1 | 3/2003 | Alluri et al. | |
| 2003/0111678 A1 | 6/2003 | Colombo et al. | |
| 2007/0001244 A1 * | 1/2007 | Shimamoto et al. | 257/411 |
| 2007/0108514 A1 * | 5/2007 | Inoue et al. | 257/330 |
| 2008/0119057 A1 | 5/2008 | Chua et al. | |
| 2008/0164582 A1 | 7/2008 | Govindarajan | |
| 2008/0203500 A1 | 8/2008 | Ogura et al. | |
| 2008/0203529 A1 | 8/2008 | Kang et al. | |
| 2008/0217706 A1 * | 9/2008 | Muraoka et al. | 257/410 |
| 2009/0115002 A1 * | 5/2009 | Tatsumi et al. | 257/412 |
| 2010/0052074 A1 * | 3/2010 | Lin et al. | 257/407 |
| 2010/0213574 A1 | 8/2010 | Li et al. | |
| 2012/0012939 A1 * | 1/2012 | Wenwu et al. | 257/369 |
| 2012/0037902 A1 | 2/2012 | Srividya et al. | |
| 2012/0061773 A1 | 3/2012 | Tsuchiya | |
| 2012/0132997 A1 * | 5/2012 | Tokita | 257/368 |
| 2012/0261773 A1 * | 10/2012 | Ogawa | 257/412 |

FOREIGN PATENT DOCUMENTS

| | | |
|---|---|---|
| JP | 2012-043823 | 3/2012 |
| WO | WO-2006/022175 A1 | 3/2006 |

* cited by examiner

FABRICATING METHOD OF A SEMICONDUCTOR DEVICE

CROSS-REFERENCE TO RELATED APPLICATION

Korean Patent Application No. 10-2012-0117831, filed on Oct. 23, 2012, in the Korean Intellectual Property Office, and entitled: "Fabricating Method Of A Semiconductor Device," is incorporated by reference herein in its entirety.

BACKGROUND

1. Field

Embodiments relate to a fabricating method of a semiconductor device.

2. Description of the Related Art

As the feature size of MOS transistors has been reduced, the length of the gate and the length of the channel formed therebelow have also gradually decreased. Accordingly, it is desirable to increase the capacitance between the gate and the channel and to improve operating characteristics of the MOS transistor.

SUMMARY

Embodiments are directed to a fabricating method of a semiconductor device, including stacking a high-k dielectric film not containing silicon (Si) and an insulating film containing silicon (Si) on a substrate, and diffusing Si contained in the insulating film into the high-k dielectric film by annealing the substrate having the high-k dielectric film and the insulating film stacked thereon.

The high-k dielectric film and the insulating film may include at least one of $HfO_2$ and $ZrO_2$.

The high-k dielectric film may include at least one of $HfO_2$ and $ZrO_2$. The insulating film may include $SiO_2$.

The stacking of the high-k dielectric film and the insulating film may include forming the insulating film on the high-k dielectric film.

The stacking of the high-k dielectric film and the insulating film may include forming the high-k dielectric film on the insulating film.

Embodiments are also directed to a fabricating method of a semiconductor device, including forming an interlayer insulating film including a trench on a substrate, stacking a high-k first film not containing silicon (Si) and a second film containing Si along the sidewall and bottom surface of the trench, diffusing Si contained in the second film into the first film by annealing the substrate having the first film and the second film stacked thereon, thereby forming a gate insulating film containing Si and including the first film and the second film, and forming a metal film on the gate insulating film in the trench.

The first film and the second film may include at least one of $HfO_2$ and $ZrO_2$.

The first film may include at least one of $HfO_2$ and $ZrO_2$, and the second film may include $SiO_2$.

The stacking of the first film and the second film may include forming the first film on the second film.

The stacking of the first film and the second film may include forming the second film on the first film.

The stacking of the first film and the second film may include forming the first film between a plurality of second films.

The forming of the first film not containing Si or the second film containing Si may include forming the first film or the second film by an atomic layer deposition (ALD) process.

The second film may be formed by the ALD process, the ALD process including one or more cycles. A hafnium (Hf) precursor, a silicon (Si) precursor, and an oxidant may be sequentially injected during each cycle.

The second film may be formed by the ALD process, the ALD process including a one or more cycles. A hafnium (Hf) precursor, an oxidant, a silicon (Si) precursor, and an oxidant may be sequentially injected during each cycle.

The fabricating method may further include, after forming the gate insulating film, diffusing nitrogen into the gate insulating film.

Embodiments are also directed to a method of forming a gate insulating layer having a concentration gradient of silicon (Si), including stacking a first film and a second film on a substrate, the first film including at least one of $HfO_2$ and $ZrO_2$ and not containing silicon (Si), and the second film including at least one of $HfO_2$ and $ZrO_2$ or including $SiO_2$, and further including silicon (Si) in concentration of approximately 10% or greater, and annealing the substrate having the first film and the second film stacked thereon such that Si contained in the second film diffuses into the first film, forming the gate insulating layer with the concentration gradient of silicon (Si).

A concentration of silicon (Si) in the second film before the annealing may be approximately 20% to approximately 30%.

A concentration of silicon (Si) in the gate insulating layer formed by the annealing may be 10% or less.

A concentration of silicon (Si) in the gate insulating layer formed by the annealing may be in a range of approximately 3% to approximately 7%.

The method may further include diffusing nitrogen into the gate insulating film.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
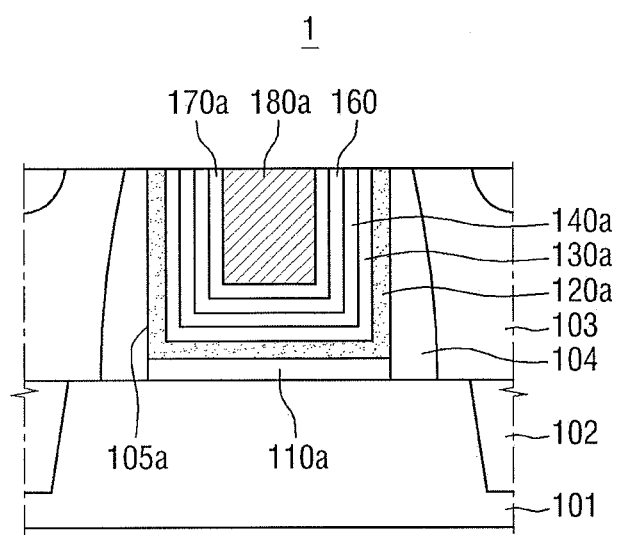
FIG. 1 illustrates a schematic sectional view of a semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The use of the terms "a" and "an" and "the" and similar referents in the context of describing the embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of skill in the art to which the embodiments belong. It is noted that the use of any and all examples, or exemplary terms provided herein is intended merely to better illuminate the embodiments and is not a limitation on the scope thereof unless otherwise specified. Further, unless defined otherwise, all terms defined in generally used dictionaries may not be overly interpreted.

Embodiments will be described with reference to perspective views, cross-sectional views, and/or plan views, in which exemplary embodiments are shown. Thus, the profile of an exemplary view may be modified according to manufacturing techniques and/or allowances. That is, the embodiments are not intended to limit the scope thereof, but may cover all changes and modifications that may occur due to a change in manufacturing process. Thus, regions shown in the drawings are illustrated in schematic form and the shapes of the regions are presented simply by way of illustration and not as a limitation.

FIG. 1 illustrates a schematic sectional view of a semiconductor device according to an embodiment. An N-type transistor gate is illustrated in FIG. 1 by way of example.

Referring to FIG. 1, the semiconductor device 1 according to this embodiment includes a substrate 101, an interlayer insulating film 103 including a first trench 105a, a first interface film 110a, a first gate insulating film 120a, a first capping film 130a, a first etch stopper film 140a, a first work function control film 160, a first diffusion control film 170a, and a first gate pattern 180a.

The substrate 101 may be a rigid substrate or a flexible substrate. The rigid substrate may be a substrate made of one or more semiconductor materials selected from the group of, for example, Si, Ge, SiGe, GaP, GaAs, SiC, SiGeC, InAs and InP, a silicon on insulator (SOI) substrate, a quartz substrate, or a glass substrate for display. The flexible substrate may be a flexible plastic substrate made of polyimide, polyethylene terephthalate (PET), polyethylene naphthalate (PEN), polymethyl methacrylate (PMMA), polycarbonate (PC), polyether sulfone (PES), or polyester.

An interlayer insulating film 103 including a first trench 105a may be formed on the substrate 101. The interlayer insulating film 103 may be formed by stacking two or more layers of insulating films. As shown in FIG. 1, a spacer 104 may be formed on the sidewall of the first trench 105a and the substrate 101 may be disposed on the bottom surface of the first trench 105a, as examples.

An isolation region 102 defining an active region may be formed on the substrate 101. For example, the isolation region 102 may be made of a shallow trench isolation (STI) oxide or a field oxide (FOX).

The spacer 104 may be formed of at least one of a nitride film and an oxynitride film. In an implementation, the spacer 104 may be formed in an L shape.

In the first trench 105a are provided a first interface film 110a, a first gate insulating film 120a, a first capping film 130a, a first etch stopper film 140a, a first work function control film 160, a first diffusion control film 170a and a first gate pattern 180a.

The first interface film 110a may be formed along the bottom surface of the first trench 105a. The first interface film 110a may serve to prevent an interfacial failure between the substrate 101 and the first gate insulating film 120a. The first interface film 110a may include, for example, a low-k dielectric layer having a dielectric constant (k) of 9 or less, a silicon oxide film having a dielectric constant (k) of approximately 4, or a silicon oxynitride film having a dielectric constant (k) in a range of 4 to 8 according to the concentration of oxygen or nitrogen atoms. In addition, the first interface film 110a may include a silicate, or a combination of the films listed above.

The first gate insulating film 120a may be conformally formed along the sidewall and bottom surface of the first trench 105a. The first gate insulating film 120a may include a high-k dielectric material having a higher dielectric constant than a silicon oxide film. For example, the first gate insulating film 120a may include a material selected from the group of SiON, $HfO_2$, $ZrO_2$, $Ta_2O_5$, $TiO_2$, $SrTiO_5$ and $(Ba,Sr)TiO_5$. The first gate insulating film 120a may be formed to an appropriate thickness according to the kind of a target device to be formed. The first gate insulating film 120a may be formed to a thickness of, for example, approximately 30 Å.

At least a portion of the first gate insulating film 120a may be a nitride, containing nitrogen. As will be described below, the first gate insulating film 120a may be a nitride that is formed using a plasma.

The first gate insulating film 120a may contain silicon (Si). A concentration of Si contained in the first gate insulating film 120a may be approximately 10% or less, or, for example, in a range of approximately 3% to approximately 7%. The first gate insulating film 120a may be formed by stacking a first film not containing Si and a second film containing Si, as will be described below, and annealing the substrate 101 having the stack of the first film and the second film. Accordingly, the first gate insulating film 120a may contain Si with a concentration gradient decreasing toward the substrate 101 or toward the first capping film 130a.

If Si is contained in the gate insulating film including a high-k dielectric material in a large concentration, the dielectric constant may decrease, and the thickness of the inversion layer (Tiny) may increase. However, if Si is contained in the gate insulating film in a small concentration (for example, approximately 10% or less, or, for example, in a range of approximately 3% to approximately 7%), the high-k dielectric material, e.g., $HfO_2$, may be crystallized into a tetragonal phase, resulting in a reduction in the gate leakage current without increasing the Tiny.

If Si is contained in the first gate insulating film 120a, an oxygen vacancy in the first gate insulating film 120a may be reduced. Even when the first gate insulating film 120a is nitrided, nitrogen may not diffuse into the first interface film 110a but may stay in the first gate insulating film 120a, thereby improving the bias-temperature instability (BTI) characteristic. If the concentration of Si contained in an upper portion of the first gate insulating film 120a is relatively high, it may be possible to suppress a diffusing material (e.g., Al), to be described below, from being diffused into the first gate insulating film 120a, and time-dependent dielectric breakdown (TDDB) improvement can be brought about. If the concentration of Si contained in a lower portion of the first gate insulating film 120a is relatively high, deterioration of the first interface film 110a due to a reaction between the first interface film 110a and the first gate insulating film 120a may be suppressed.

The first capping film 130a may be formed on the first gate insulating film 120a in the first trench 105a. As shown in FIG. 1, the first capping film 130a may be conformally formed along the sidewall and bottom surface of the first trench 105a. The first capping film 130a may include, for example, TiN. The first capping film 130a may be formed to an appropriate thickness according to the kind of target device to be formed. The first capping film 130a may be formed to a thickness in a range of, for example, approximately 5 Å to approximately 50 Å.

The first etch stopper film 140a may be formed on the first capping film 130a in the first trench 105a. As shown in FIG. 1, the first etch stopper film 140a may be conformally formed along the sidewall and bottom surface of the first trench 105a. The first etch stopper film 140a may include, for example, TaN. The first etch stopper film 140a may be formed to an appropriate thickness according to the kind of target device to be formed. The first etch stopper film 140a may be formed to a thickness in a range of, for example, approximately 5 Å to approximately 30 Å.

FIG. 1 shows that the first capping film 130a and the first etch stopper film 140a are distinct from each other. However, in other implementations, the first capping film 130a and the first etch stopper film 140a may be integrally formed as a single film. In this case, the single film may be a film including at least one of TiN and TaN.

The first work function control film 160 may be formed on the first etch stopper film 140a in the first trench 105a. As shown in FIG. 1, the first work function control film 160 may be conformally formed along the sidewall and bottom surface of the first trench 105a. The first work function control film 160 may be a work function control film of a first conductivity type. The first conductivity type may be an N type. The first work function control film 160 may control operating characteristics of an N type transistor by adjusting a work function of the N type transistor. The first work function control film 160 may include, for example, TiAl. The first work function control film 160 may be formed to a thickness in a range of, for example, approximately 50 Å to approximately 150 Å.

The first diffusion control film 170a may be formed on the first trench 105a on the first work function control film 160. As shown in FIG. 1, the first diffusion control film 170a may be conformally formed along the sidewall and bottom surface of the first trench 105a. The first diffusion control film 170a may include, for example, Ti. The diffusion amount and speed of the diffusing material contained in the first gate pattern 180a to be described below may be adjusted according to the thickness of the first diffusion control film 170a. The first diffusion control film 170a may be formed to a thickness in a range of, for example, approximately 50 Å to approximately 150 Å.

The first gate pattern 180a may be formed on the first diffusion control film 170a in the first trench 105a to fill the first trench 105a. The first gate pattern 180a may include a diffusing material. The diffusing material may include, for example, Al.

The diffusing material may be diffused from the first gate pattern 180a and may be present on the first gate insulating film 120a. The diffusing material may be diffused from the first work function control film 160. If the diffusing material is present on the first gate insulating film 120a, a threshold voltage of a transistor may be reduced, thereby improving electric properties of the transistor. The diffusing material may be diffused from the first gate pattern 180a through annealing. Accordingly, concentrations of the diffusing material may have a gradient decreasing from the first gate pattern 180a to the first diffusion control film 170a, the first work function control film 160, the first etch stopper film 140a, the first capping film 130a and to the first gate insulating film 120a, in that order.

Figure 2:
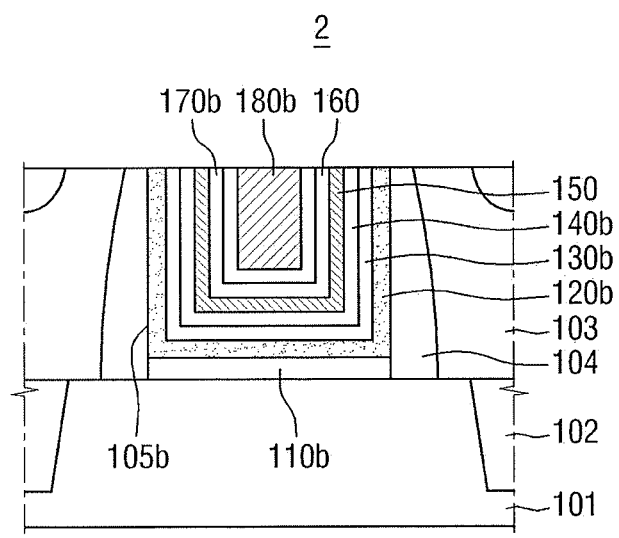
FIG. 2 illustrates a schematic sectional view of a semiconductor device according to another embodiment.

FIG. 2 illustrates a schematic sectional view of a semiconductor device according to another embodiment. A P-type transistor gate is illustrated in FIG. 2 by way of example. For the sake of convenient explanation, the following description will focus on differences between the semiconductor devices shown in FIGS. 1 and 2.

Referring to FIG. 2, the semiconductor device 2 according to this embodiment includes a substrate 101, an interlayer insulating film 103 including a second trench 105b, a second interface film 110b, a second gate insulating film 120b, a second capping film 130b, a second etch stopper film 140b, a second work function control film 160, first work function control film 160, a second diffusion control film 170b, and a second gate pattern 180b.

The second work function control film 150 may be formed between a second etch stopper film 140b in a second trench 150b and the first work function control film 160. As shown in FIG. 2, the second work function control film 150 may be conformally formed along the sidewall and bottom surface of the second trench 105b. The second work function control film 150 may be a work function control film of a second conductivity type. The second conductivity type may be a P type. The second work function control film 150 may control operating characteristics of a P type transistor by adjusting a work function of the P type transistor. The second work function control film 150 may include, for example, TiN. The second work function control film 150 may be formed to a thickness in a range of, for example, approximately 5 Å to approximately 50 Å.

Figure 3:
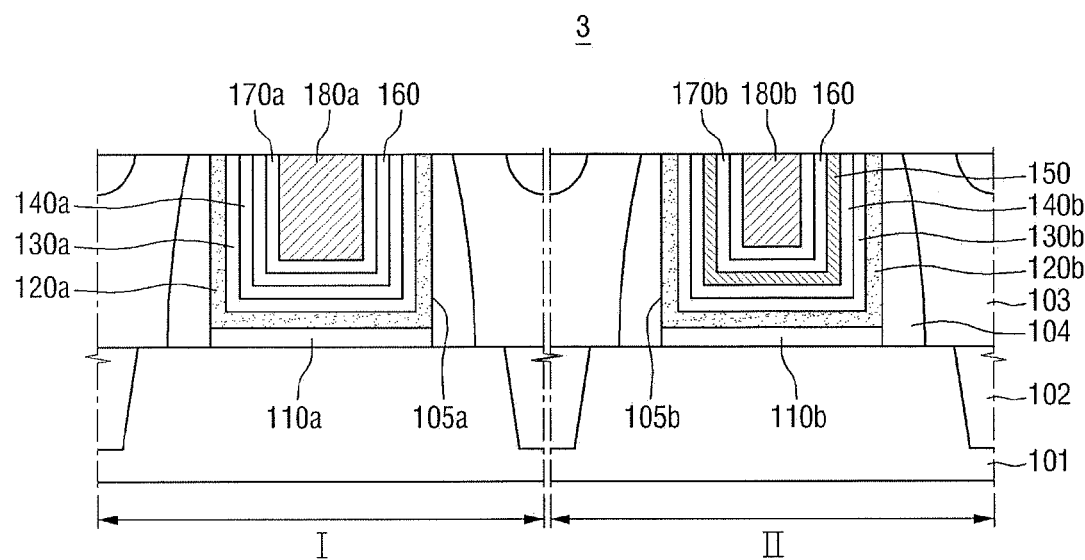
FIG. 3 illustrates a schematic sectional view of a semiconductor device according to another embodiment.

FIG. 3 illustrates a schematic sectional view of a semiconductor device according to another embodiment.

Referring to FIG. 3, in the semiconductor device 3 according to this embodiment, a first region I and a second region II are defined in a substrate 101. An N type transistor may be formed in the first region I of the substrate 101, and a P type transistor may be formed in the second region II of the substrate 101.

An isolation region 102 defining the first region I and the second region II may be formed on the substrate 101. For example, the isolation region 102 may be made of a shallow trench isolation (STI) oxide or a field oxide (FOX).

The interlayer insulating film 103 including trenches 105a and 105b may be formed on the substrate 101. The interlayer insulating film 103 may be formed by stacking two or more layers of insulating films. As shown in FIG. 3, the interlayer insulating film 103 may include a first trench 105a disposed on the first region I of the substrate 101 and a second trench 105b disposed on the second region II of the substrate 101 substrate 101.

The N type transistor formed on the first region I may be the same as the semiconductor device 1 shown in FIG. 1, and the P type transistor formed on the second region II may be the same as the semiconductor device 2 shown in FIG. 2. Therefore, detailed descriptions thereof will not be repeated.

Hereinafter, a fabricating method of the semiconductor device according to an embodiment will be described with reference to FIGS. 4 to 10. FIGS. 4 to 10 illustrate intermediate process stages in order to explain a fabricating method of the semiconductor device according to this embodiment.

Figure 4:
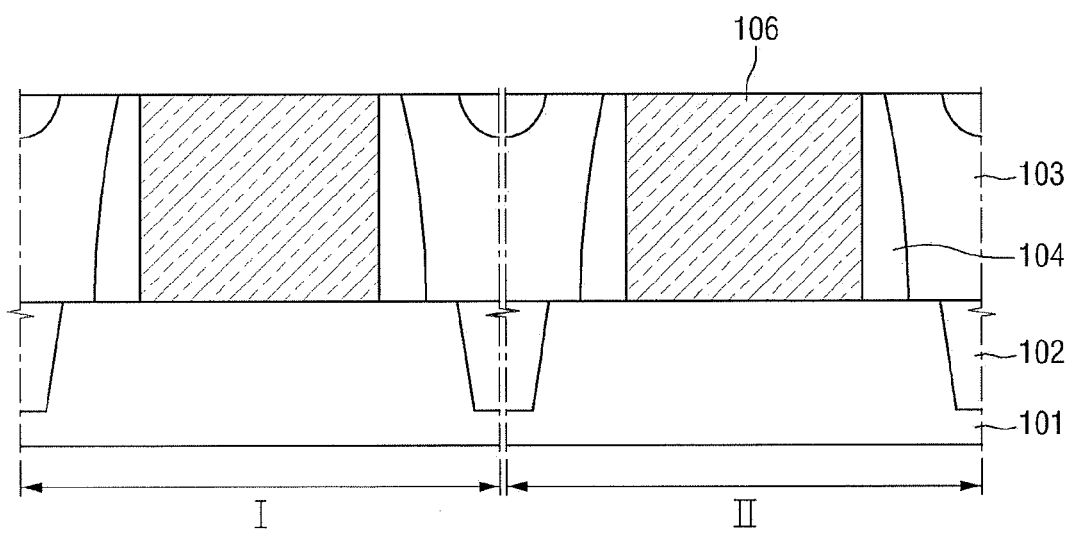
FIGS. 4 to 10 illustrate intermediate process stages in order to explain a fabricating method of the semiconductor device according to an embodiment.

Referring to FIG. 4, the substrate 101 may be prepared, and the isolation region 102 defining the first region I and the second region II may be formed on the substrate 101.

A sacrificial gate 106 may be formed on the first region I and the second region II of the substrate 101, and the spacer 104 may be formed on the sidewall of the sacrificial gate 106. The sacrificial gate 106 may be made of, for example, polysilicon. The spacer 104 may be formed of at least one of a nitride film and an oxynitride film. According to an implementation, the spacer 104 may be formed in an L shape.

The interlayer insulating film 103 may be formed to surround the sacrificial gate 106 and the spacer 104. The interlayer insulating film 103 may be formed to expose a top surface of the sacrificial gate 106.

Figure 5:
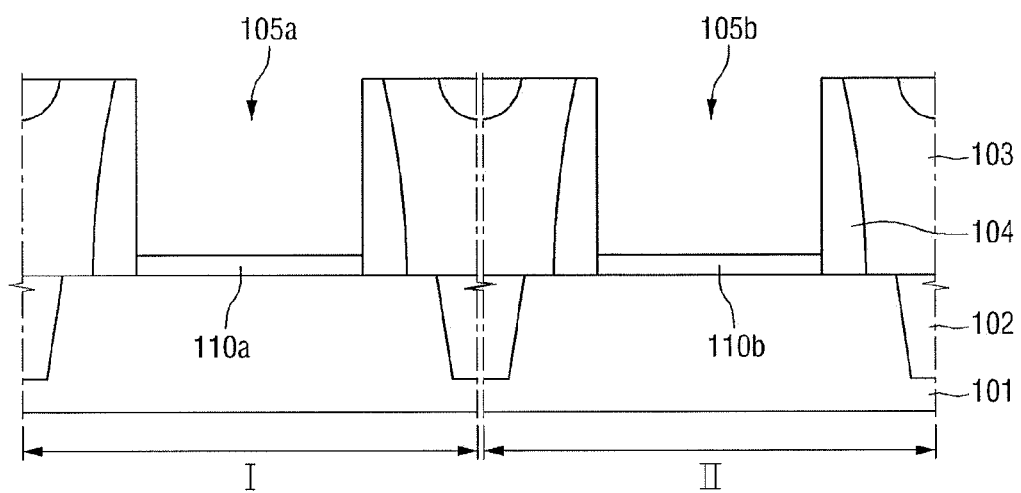

Next, referring to FIG. 5, the sacrificial gate 106 may be removed, thereby forming a first trench 105a in the first region I of the substrate 101 to expose a top surface of the substrate 101, and a second trench 105b in the second region II of the substrate 101 to expose the top surface of the substrate 101.

In addition, the first interface film 110a is formed along the bottom surface of the first trench 105a, and the second trench 105b may be formed along the bottom surface of the second interface film 110b. The first interface film 110a and the second interface film 110b may include, for example, at least one of a low-k dielectric layer having a dielectric constant (k) of 9 or less, a silicon oxide film, a silicon oxynitride film and silicate. The first interface film 110a and the second interface film 110b may be formed, for example, by oxidizing the top surface of the substrate 101.

Figure 6:
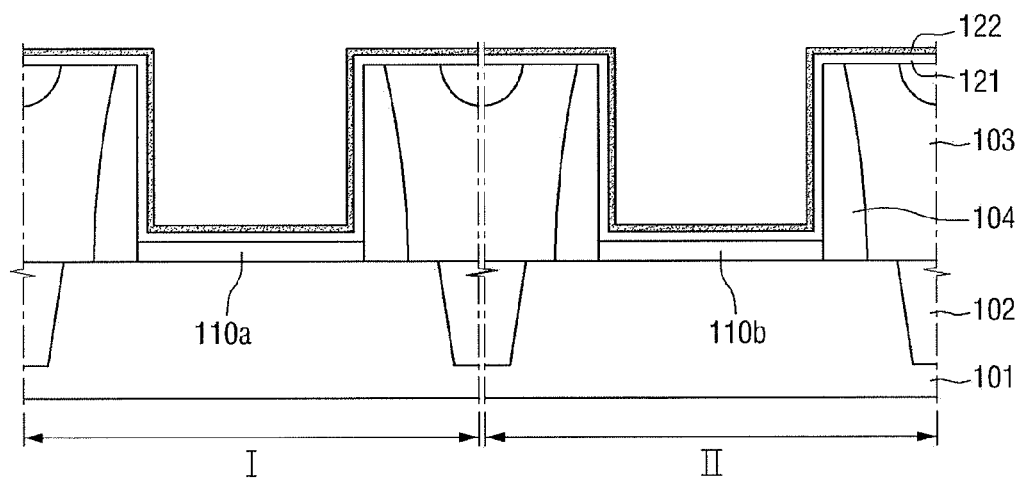

Next, referring to FIG. 6, a high-k dielectric film 121 not containing Si may be conformally formed along the top surface of the interlayer insulating film 103 and along the sidewall and bottom surface of the trenches 105a and 105b. The high-k dielectric film 121 may include, for example, at least one high-k material such as $HfO_2$ or $ZrO_2$.

An insulating film 122 containing Si may be stacked on the high-k dielectric film 121. The concentration of Si contained in the insulating film 122 may be approximately 10% or greater, For example, the concentration of Si contained in the insulating film 122 may be in a range of approximately 20% to approximately 30%. The insulating film 122 may include, for example, at least one high-k material such as $HfO_2$ and/or $ZrO_2$. The insulating film 122 may be formed to a thickness of, for example, approximately 10 Å. In addition, the insulating film 122 may include, for example, $SiO_2$. In this case, the insulating film 122 may be formed to a thickness of, for example, approximately 3 Å.

The high-k dielectric film 121 and the insulating film 122 may be formed by chemical vapor deposition (CVD), or atomic layer deposition (ALD). When the insulating film 122 of a high dielectric constant is formed by ALD, in the ALD process, a hafnium (Hf) precursor, a purge gas, a silicon (Si) precursor, a purge gas, an oxidant and a purge gas may be sequentially injected for each cycle. In other implementations, in the ALD process, a hafnium (Hf) precursor, a purge gas, an oxidant a silicon (Si) precursor, a purge gas, an oxidant and a purge gas may be sequentially injected for each cycle. In such a manner, the concentration of Si contained in the insulating film 122 may be adjusted. The high-k dielectric film 121 may be formed in substantially the same manner as the insulating film 122.

Figure 7:
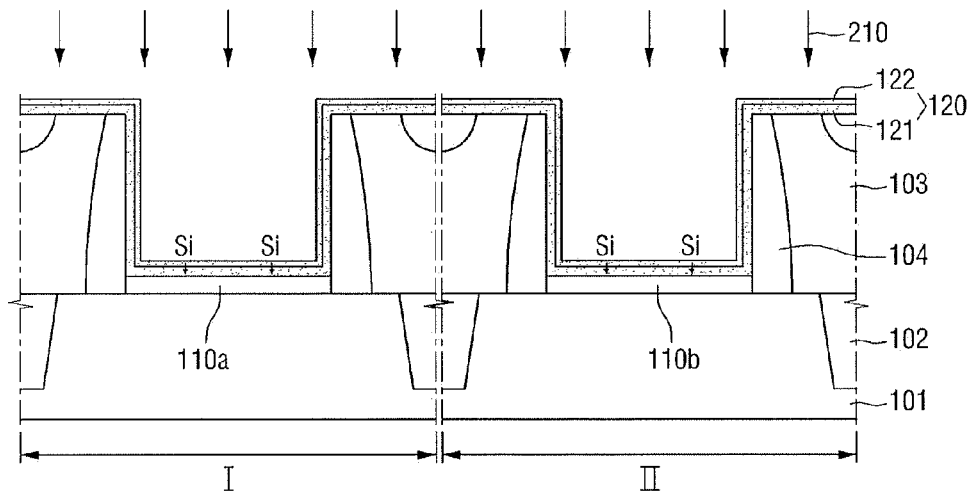

Next, referring to FIG. 7, the substrate 101 having the high-k dielectric film 121 and the insulating film 122 may be annealed (210), thereby diffusing Si contained in the insulating film 122 into the high-k dielectric film 121. Accordingly, the formation of the Si-containing gate insulating film 120 including the high-k dielectric film 121 and the insulating film 122 may be completed. A concentration of Si contained in the gate insulating film 120 may be approximately 10% or less, For example, the concentration of Si contained in the gate insulating film 120 may be in a range of approximately 3% to approximately 7%. Si may be diffused from the insulating film 122 through annealing. Accordingly, the gate insulating film 120 may contain Si with a concentration gradient decreasing toward the substrate 101.

Figure 8:
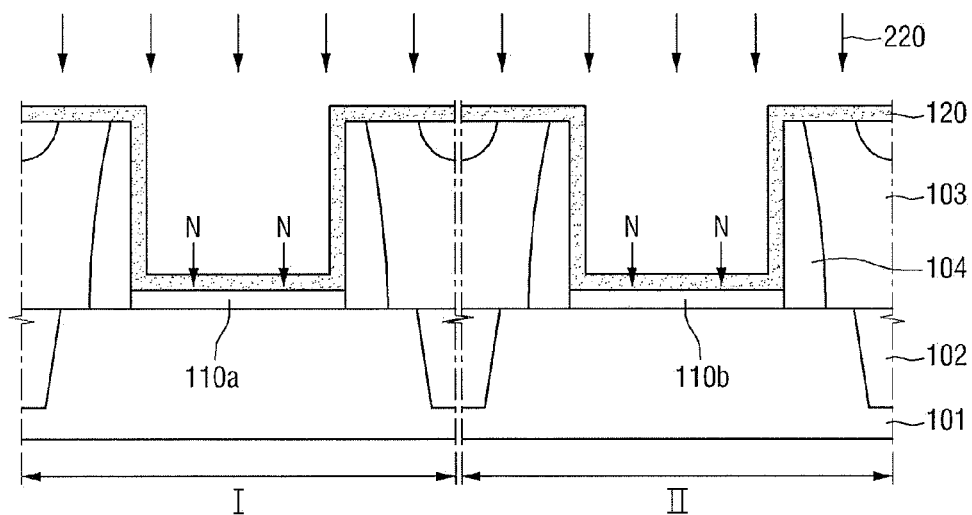

Next, referring to FIG. 8, the gate insulating film 120 is nitrided (220), thereby diffusing nitrogen into the gate insulating film 120. The gate insulating film 120 may be nitrided using plasma, for example, $NH_3$, $N_2H_4$, or $N_2$ gas.

Figure 9:
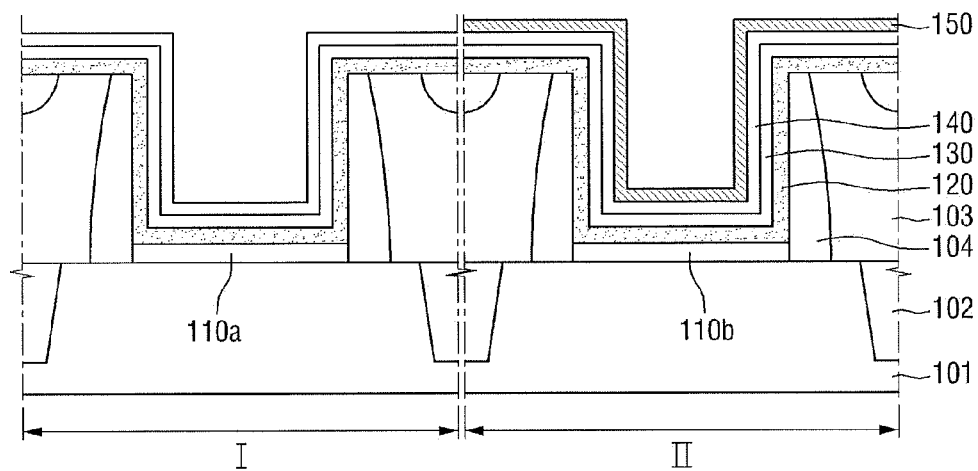

Next, referring to FIG. 9, a capping film 130 may be formed on the gate insulating film 120. The capping film 130 may include, for example, TiN. An etch stopper film 140 may be formed on the capping film 130. The etch stopper film 140 may include, for example, TaN.

The second work function control film 150 may be formed on the etch stopper film 140. The second work function control film 150 may be formed only in the second region II. The second work function control film 150 may be formed on the entire surface of the etch stopper film 140, followed by photolithography and etching, thereby removing the second work function control film 150 formed on the first region I. In the removing of the second work function control film 150 formed on the first region I, the etch stopper film 140 may serve to prevent the capping film 130 and the gate insulating film 120 from being etched. The second work function control film 150 may include, for example, TiN.

Figure 10:
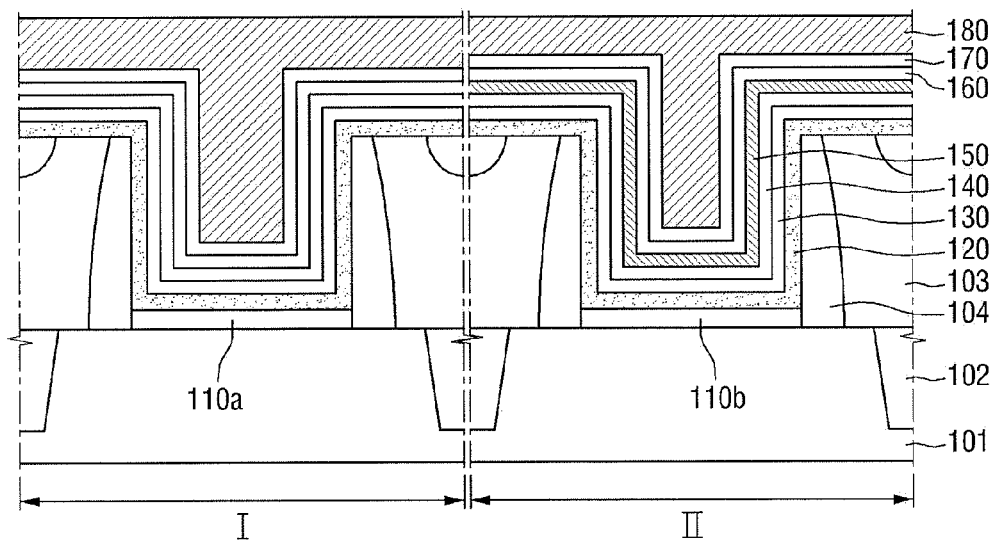

Referring to FIG. 10, the first work function control film 160 may be formed on the second work function control film 150. The first work function control film 160 may include, for example, TiAl.

A diffusion control film 170 may be formed on the first work function control film 160. The diffusion control film 170 may include, for example, Ti. A gate metal 180 filling the trench may be formed on the diffusion control film. The gate metal 180 may include a diffusing material, which may include, for example, Al. The diffusing material contained in the gate metal 180 may be diffused into an upper portion of the gate insulating film 120 through annealing. As the result of annealing, Al contained in the first work function control film 160 may also be diffused into the upper portion of the gate insulating film 120.

Referring again to FIG. 3, the top surface of the interlayer insulating film 103 may be exposed by planarization. Accordingly, an N type transistor gate may be completed on the first region I of the substrate 101, and a P type transistor gate may be completed on the second region II of the substrate 101.

Figure 11:
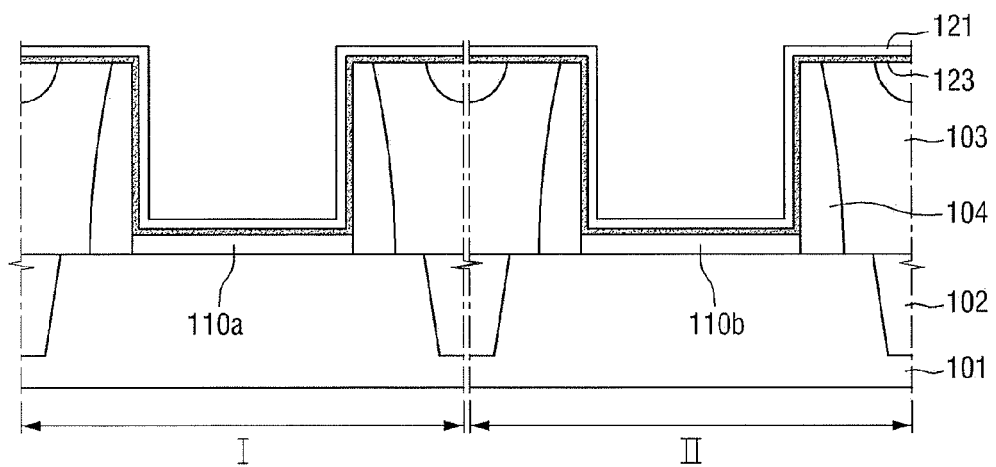
FIGS. 11 and 12 illustrate intermediate process stages in order to explain a fabricating method of the semiconductor device according to another embodiment.
Figure 12:
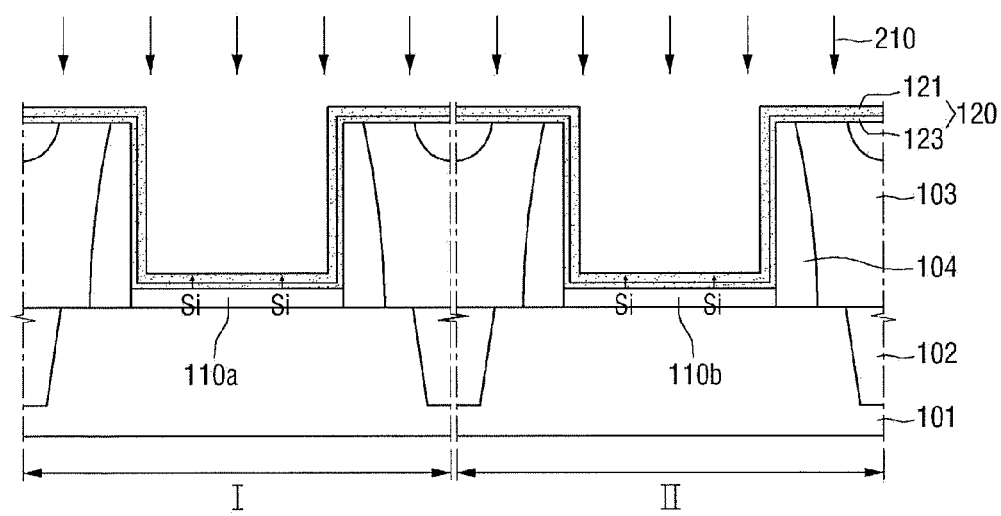

Hereinafter, a fabricating method of the semiconductor device according to the another embodiment will be described with reference to FIGS. 11 and 12. FIGS. 11 and 12 illustrate intermediate process stages in order to explain a fabricating method of the semiconductor device according to this embodiment. For the sake of convenient explanation, the following description will focus on differences between the fabricating method shown in FIGS. 4 to 10.

Referring to FIG. 11, in the fabricating method of the semiconductor device according to this embodiment, an insulating film 123 containing Si is conformally formed on a top surface of the interlayer insulating film 103 and along the sidewall and bottom surface of the trench. A concentration of Si contained in the insulating film 123 may be approximately 10% or more. For example, the concentration of Si in the insulating film 123 may be in a range of approximately 20% to approximately 30%. The insulating film 123 may include, for example, at least one high-k material such as $HfO_2$ or $ZrO_2$. In this case, the insulating film 123 may be formed to a thickness of, for example, approximately 10 Å. In addition, the insulating film 123 may include, for example, $SiO_2$. In this case, the insulating film 123 may be formed to a thickness of, for example, approximately 3 Å.

Next, a high-k dielectric film 121 not containing Si may be formed on the insulating film 123. The high-k dielectric film 121 may include, for example, at least one high-k material such as $HfO_2$ or $ZrO_2$.

The insulating film 123 and the high-k dielectric film 121 may be formed by CVD, or ALD.

Next, referring to FIG. 12, the substrate 210 having the insulating film 123 and the high-k dielectric film 121 may be annealed (210). Accordingly, Si contained in the insulating film 123 may be diffused into the high-k dielectric film 121. Therefore, the formation of the Si-containing gate insulating film 120 including the high-k dielectric film 121 and the insulating film 123 may be completed. A concentration of Si contained in the gate insulating film 120 may be approximately 10% or less. For example, the concentration of Si may be in a range of approximately 3% to approximately 7%. Si may be diffused from the insulating film 123 through annealing. Accordingly, the gate insulating film 120 may contain Si with a concentration gradient decreasing toward the capping film 130.

Figure 13:
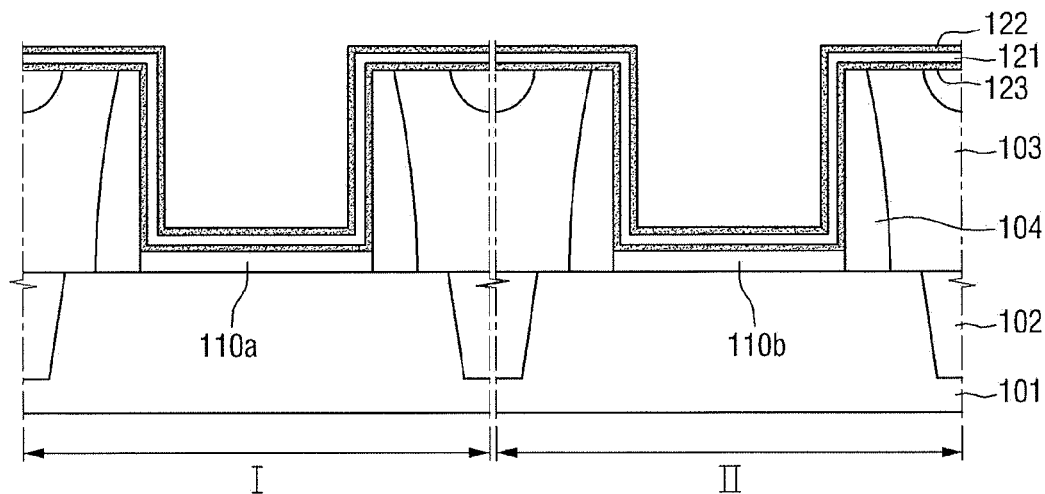
FIGS. 13 and 14 illustrate intermediate process stages in order to explain a fabricating method of the semiconductor device according to another embodiment.
Figure 14:
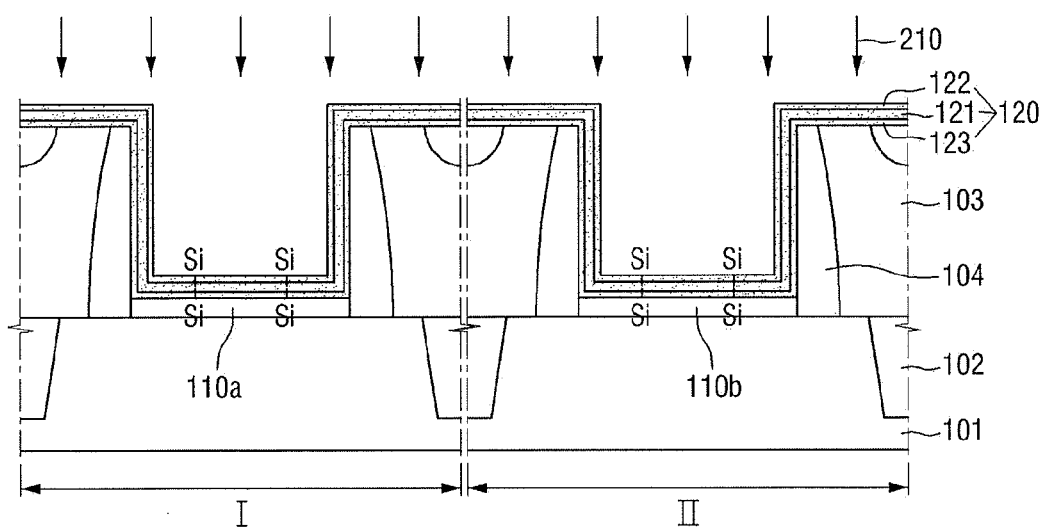

Hereinafter, a fabricating method of the semiconductor device according to another embodiment will be described with reference to FIGS. 13 and 14. FIGS. 13 and 14 illustrate intermediate process steps for explaining a fabricating method of the semiconductor device according to this embodiment. For the sake of convenient explanation, the following description will focus on differences between the fabricating methods shown in FIGS. 4 to 10.

Referring to FIG. 13, in the fabricating method of the semiconductor device according to this embodiment, an insulating film 123 containing Si may be conformally formed on a top surface of the interlayer insulating film 103 and along the sidewall and bottom surface of the trench. A concentration of Si contained in the insulating film 123 may be approximately 10% or greater. For example, the concentration of Si may be in a range of approximately 20% to approximately 30%. A high-k dielectric film 121 not containing Si may be formed on the insulating film 123. The high-k dielectric film 121 may include, for example, at least one high-k material, such as $HfO_2$ or $ZrO_2$.

Another insulating film 122 containing Si may be formed on the high-k dielectric film 121. The insulating films 122 and 123 may include, for example, at least one high-k material such as $HfO_2$ or $ZrO_2$. In this case, the overall thickness of the insulating films 122 and 123 may be, for example, approximately 10 Å. In addition, the insulating films 122 and 123 may include, for example, $SiO_2$. In this case, the overall thickness of the insulating films 122 and 123 may be, for example, approximately 3 Å.

The insulating films 122 and 123 and the high-k dielectric film 121 may be formed by CVD or ALD.

Next, referring to FIG. 14, the substrate 101 having the insulating films 122 and 123 and the high-k dielectric film 121 may be annealed (210). Accordingly, Si contained in the insulating films 122 and 123 may be diffused into the high-k dielectric film 121. Therefore, the formation of the Si-containing gate insulating film 120 including the high-k dielectric film 121 and the insulating films 122 and 123 may be completed. A concentration of Si contained in the gate insulating film 120 may be approximately 10% or less. For example, the concentration of Si in the gate insulating film 120 may be in a range of approximately 3% to approximately 7%.

Figure 15:
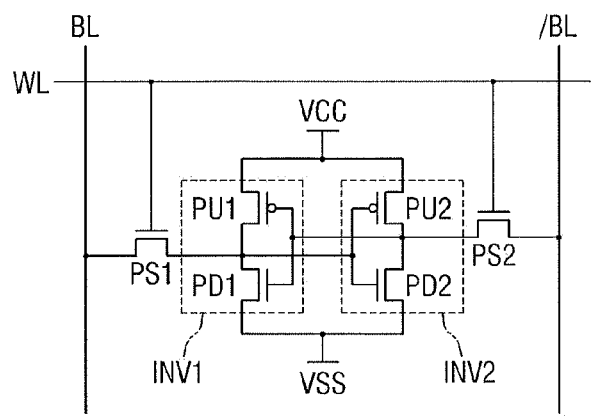
FIGS. 15 and 16 illustrate a circuit view and a layout view for explaining a fabricating method of a semiconductor device according to another embodiment.
Figure 16:
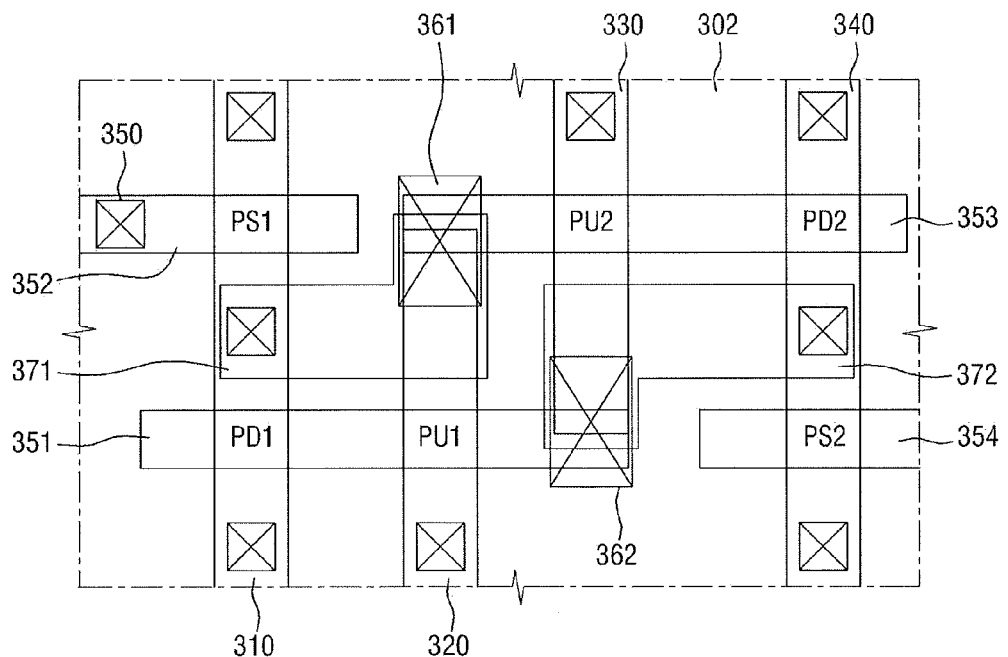

FIGS. 15 and 16 illustrate a circuit view and a layout view for explaining a fabricating method of a semiconductor device according to another embodiment.

Referring to FIG. 15, the semiconductor device 9 according to this embodiment may include a pair of inverters INV1 and INV2 connected in parallel between a power supply node Vcc and a ground node Vss, and a first pass transistor PS1 and a second pass transistor PS2 connected to output nodes of the respective inverters INV1 and INV2. The first pass transistor PS1 and the second pass transistor PS2 may be connected to a bit line BL and a complementary bit line/BL, respectively. Gates of the first pass transistor PS1 and the second pass transistor PS2 may be connected to a word line WL.

The first inverter INV1 may include a first pull-up transistor PU1 and a first pull-down transistor PD1 connected in series to each other, and the second inverter INV2 includes a second pull-up transistor PU2 and a second pull-down transistor PD2 connected in series to each other. The first pull-up transistor PU1 and the second pull-up transistor PU2 may be PMOS transistors, and the first pull-down transistor PD1 and the second pull-down transistor PD2 may be NMOS transistors.

In order to constitute a latch circuit, an input node of the first inverter INV1 may be connected to an output node of the second inverter INV2, and an input node of the second inverter INV2 may be connected to an output node of the first inverter INV1.

Referring to FIG. 16, a first active region 310, a second active region 320, a third active region 330, and a fourth active region 340, spaced apart from one another, may be formed to extend in one direction (for example, in an up-and-down direction of FIG. 16). The second active region 320 and the third active region 330 may extend in shorter lengths than the first active region 310 and the fourth active region 340.

A first gate electrode 351, a second gate electrode 352, a third gate electrode 353, and a fourth gate electrode 354 may be formed to extend in another direction (for example, in a left-and-right direction of FIG. 16) to intersect the first active region 310 to the fourth active region 340. The first gate electrode 351 may completely intersect the first active region 310 and the second active region 320 while partially overlapping a terminal of the third active region 330. The third gate electrode 353 may completely intersect the fourth active region 340 and the third active region 330 while partially overlapping a terminal of the second active region 320. The second gate electrode 352 and the fourth gate electrode 354 may be formed to intersect the first active region 310 and the fourth active region 340, respectively.

As shown in FIG. 16, the first pull-up transistor PU1 may be defined in the vicinity of an intersection of the first gate electrode 351 and the second active region 320, the first pull-down transistor PD1 may be defined in the vicinity of an intersection of the first gate electrode 351 and the first active region 310, and the first pass transistor PS1 may be defined in the vicinity of an intersection of the second gate electrode 352 and the first active region 310. The second pull-up transistor PU2 may be defined in the vicinity of an intersection of the third gate electrode 353 and the third active region 330, the second pull-down transistor PD2 may be defined in the vicinity of an intersection of the third gate electrode 353 and the fourth active region 340, and the second pass transistor PS2 may be defined in vicinity of an intersection of the fourth gate electrode 354 and the fourth active region 340.

Source/drain may be formed at opposite sides of the respective intersections of the first to fourth gate electrodes 351-354 and the first to fourth active regions 310, 320, 330 and 340.

In addition, a plurality of contacts 350 may be formed.

A first shared contact 361 may concurrently connect the second active region 320, a third gate line 353 and an interconnection 371. A second shared contact 362 may concurrently connect the third active region 330, a first gate line 351 and an interconnection 372. For example, the first pull-up transistor PU1 and the second pull-up transistor PU2 may have the same configuration as the semiconductor device shown in FIG. 2, and the first pull-down transistor PD1, the first pass transistor PS1, the second pull-down transistor PD2 and the second pass transistor PS2 may have the same configuration as the semiconductor device shown in FIG. 1. The semiconductor devices shown in FIGS. 1 and 2 may be formed by the methods disclosed herein.

Figure 17:
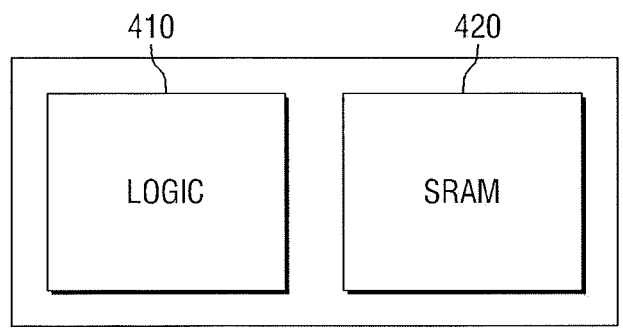
FIG. 17 illustrates a schematic sectional view of a semiconductor device according to a another embodiment.

FIG. 17 illustrates a schematic sectional view of a semiconductor device according to another embodiment.

Referring to FIG. 17, the semiconductor device according to this embodiment may include a logic region 410 and an SRAM region 420.

In some implementations, the configurations of the semiconductor devices shown in FIGS. 1 to 3 may be applied to the logic region 410 and not be applied to the SRAM region 420. In other implementations, the configurations of the semiconductor devices shown in FIGS. 1 to 3 may be applied to both of the logic region 410 and the SRAM region 420. In other implementations, the configurations of the semiconductor devices shown in FIGS. 1 to 3 may be applied to the SRAM region 420 and not be applied to the logic region 410. The semiconductor devices shown in FIGS. 1 to 3 may be formed by the methods disclosed herein.

The logic region 410 and the SRAM region 420 are illustrated in FIG. 17 by way of example. In other implementations, the various embodiments may be applied to a region including a different memory type (for example, DRAM, MRAM, RRAM, PRAM, etc.) from the memory of the logic region 410.

Figure 18:
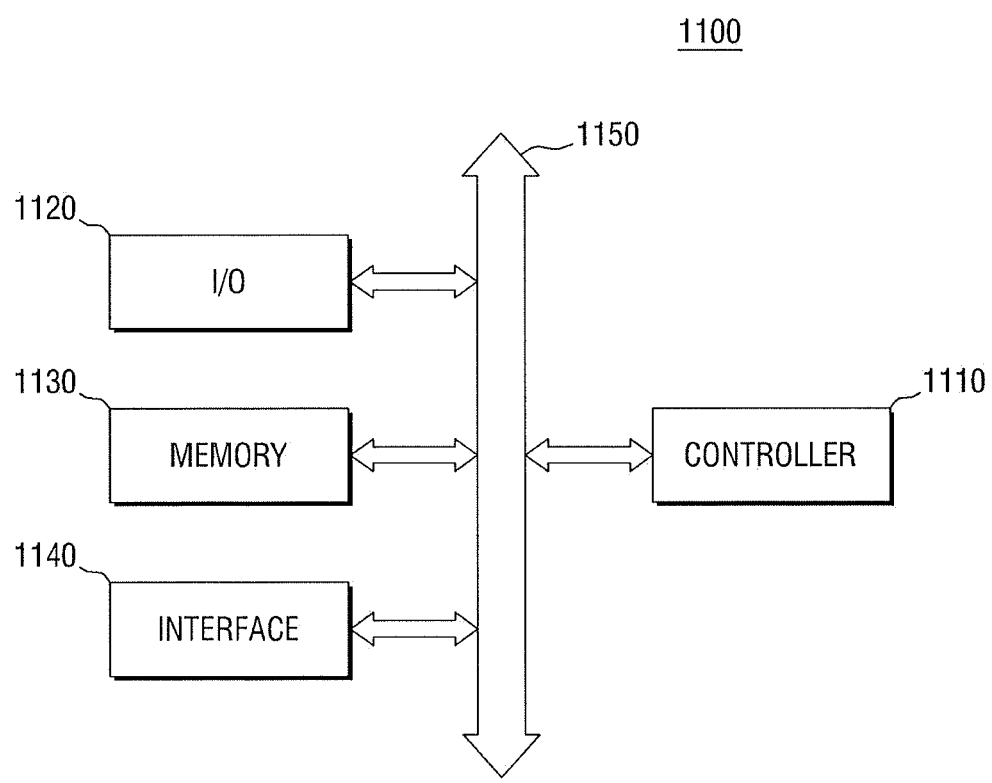
FIG. 18 illustrates a block diagram of an electronic system including a semiconductor device according to embodiments.

FIG. 18 illustrates a block diagram of an electronic system including a semiconductor device according to some embodiments.

Referring to FIG. 18, the electronic system 1100 may include a controller 1110, an input/output device (I/O) 1120, a memory 1130, an interface 1140, and a bus 1150.

The controller 1110, the I/O 1120, the memory 1130, and/or the interface 1140 may be connected to each other through the bus 1150. The bus 1150 may correspond to a path along which data moves.

The controller 1110 may include at least one of a microprocessor, a digital signal processor, a microcontroller, or logic devices capable of performing functions similar to those of these components. The I/O 1120 may include a keypad, a keyboard, a display, etc. The memory 1130 may store data and/or commands.

The interface 1140 may transmit data to a communication network or receive data from the communication network. The interface 1140 may be wired or wireless. For example, the interface 1140 may include an antenna or a wired/wireless transceiver. The electronic system 1100 may include an operating memory for improving the operation of the controller 1110 and may further include a high-speed DRAM and/or SRAM.

A fin field effect transistor may be provided in the memory 1130 or may be provided as part of the controller 1110 or the I/O 1120. The configurations of the semiconductor devices shown in FIGS. 1 to 3 may be applied to the memory 1130 or may be provided as part of the controller 1110 or the I/O 1120. The semiconductor devices shown in FIGS. 1 to 3 may be formed by the methods disclosed herein.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 19:
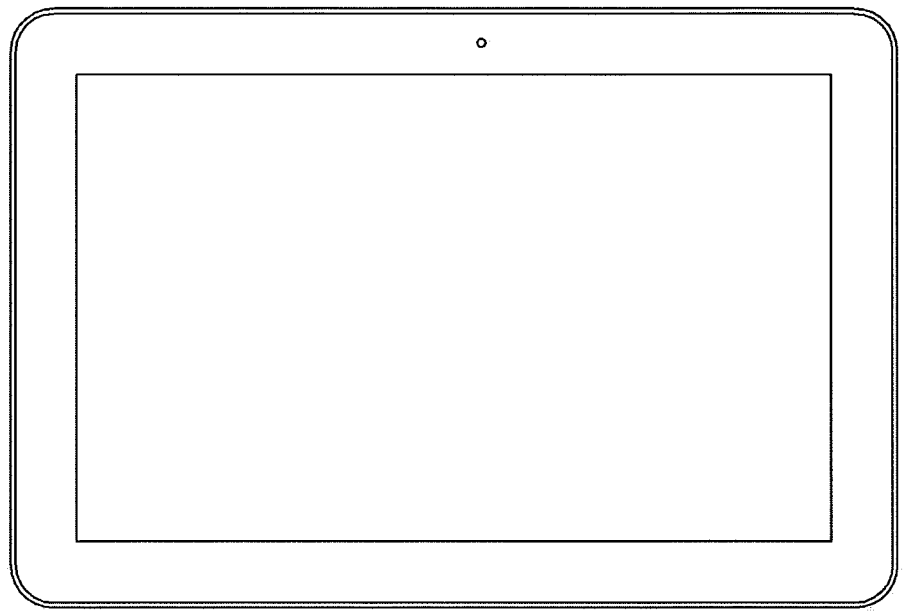
FIGS. 19 and 20 illustrate exemplary semiconductor systems to which the semiconductor device according to embodiments may be applied.
Figure 20:
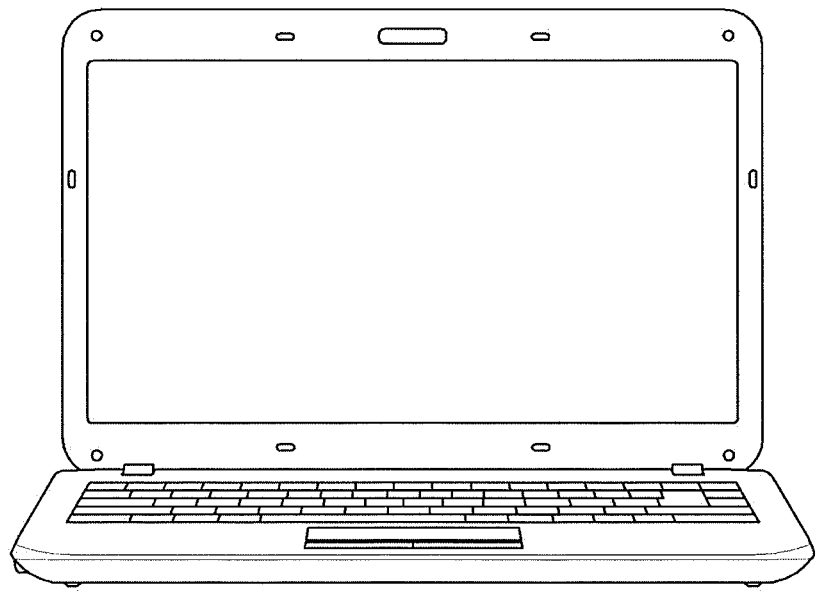

FIGS. 19 and 20 illustrate exemplary semiconductor systems to which the semiconductor device according to some embodiments can be applied.

FIG. 19 illustrates a tablet PC, and FIG. 20 illustrates a notebook computer. At least one of the semiconductor devices according to embodiments can be applied to the tablet PC, a notebook computer, or the like. In other implementations, at least one of the semiconductor devices according to embodiments can be applied to other integrated circuit devices.

By way of summation and review, as the thickness of a silicon oxide film used as a gate insulating film has been reduced, physical limitations of the silicon oxide film in view of electrical properties have become apparent. Therefore, in order to replace the silicon oxide film, research into high-k dielectric films having a high dielectric constant has been conducted.

In addition, polysilicon mainly used as a gate material has greater resistance than most metals. Therefore, a current trend has been to replace polysilicon gate electrodes with metal gate electrodes.

Embodiments provide a fabricating method of a semiconductor device having improved operating characteristics Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A fabricating method of a semiconductor device comprising:

stacking a high-k dielectric film not containing silicon (Si) and an insulating film containing silicon dioxide on a substrate, including forming the insulating film on the high-k dielectric film the insulating film including at least one of $HfO_2$ and $ZrO_2$, wherein a concentration of silicon (Si) in the insulating film is approximately 10% or greater; and diffusing Si contained in the insulating film into the high-k dielectric film between the insulating film and the substrate by annealing the substrate having the high-k dielectric film and the insulating film stacked thereon.

2. The fabricating method as claimed in claim 1, wherein the insulating film includes a single layer.

3. The fabricating method as claimed in claim 1, wherein the high-k dielectric film includes at least one of $HfO_2$ and $ZrO_2$.

4. The fabricating method as claimed in claim 1, wherein the stacking of the high-k dielectric film and the insulating film further includes forming the high-k dielectric film on another insulating film such that the high-k dielectric film is between two layers of insulating films, prior to annealing the substrate.

5. A fabricating method of a semiconductor device comprising:

forming an interlayer insulating film including a trench on a substrate;

stacking a high-k first film not containing silicon (Si) and a second film containing Si along the sidewall and bottom surface of the trench, including forming the second film over the first film, the second film including at least one of $HfO_2$ and $ZrO_2$;

diffusing Si contained in the second film formed over the first film into the first film by annealing the substrate having the first film and the second film stacked thereon, thereby forming a gate insulating film containing Si and including the first film and the second film; and forming a metal film on the gate insulating film in the trench.

6. The fabricating method as claimed in claim 5, wherein the first film includes at least one of $HfO_2$ and $ZrO_2$, and the second film includes a first layer including the at least one of $HfO_2$ and $ZrO_2$ and a second layer including $SiO_2$.

7. The fabricating method as claimed in claim 5, wherein the stacking of the first film and the second film further includes forming another second film under the first film, prior to annealing the substrate.

8. The fabricating method as claimed in claim 5, wherein the forming of the first film not containing Si or the second film containing Si includes forming the first film or the second film by an atomic layer deposition (ALD) process.

9. The fabricating method as claimed in claim 8, wherein:
the second film is formed by the ALD process, the ALD process including one or more cycles, and
a hafnium (Hf) precursor, a silicon (Si) precursor, and an oxidant are sequentially injected during each cycle.

10. The fabricating method as claimed in claim 8, wherein:
the second film is formed by the ALD process, the ALD process including a one or more cycles, and
a hafnium (Hf) precursor, an oxidant, a silicon (Si) precursor, and an oxidant are sequentially injected during each cycle.

11. The fabricating method as claimed in claim 5, further including, after forming the gate insulating film, diffusing nitrogen into the gate insulating film.

12. A method of forming a gate insulating layer having a concentration gradient of silicon (Si), the method comprising:

stacking a first film and a second film on a substrate, the first film including at least one of $HfO_2$ and $ZrO_2$ and not containing silicon (Si), and the second film including at least one of $HfO_2$ and $ZrO_2$ and including $SiO_2$, wherein a concentration of silicon (Si) in the second film is approximately 10% or greater; and annealing the substrate having the first film and the second film stacked thereon such that Si contained in the second film diffuses into the first film, forming the gate insulating layer with the concentration gradient of silicon (Si) through the gate insulating layer.

13. The method of claim 12, wherein a concentration of silicon (Si) in the second film before the annealing is approximately 20% to approximately 30%.

14. The method of claim 12, wherein a concentration of silicon (Si) in the gate insulating layer formed by the annealing is 10% or less.

15. The method of claim 12, wherein a concentration of silicon (Si) in the gate insulating layer formed by the annealing is in a range of approximately 3% to approximately 7%.

16. The method of claim 12, further including diffusing nitrogen into the gate insulating film.

17. The method of claim 12, wherein the concentration gradient of silicon (Si) includes a concentration of silicon constantly decreasing through an entire thickness of the gate insulating layer in a direction toward the substrate.

18. The method of claim 12, wherein the concentration gradient of silicon (Si) includes a concentration of silicon constantly decreasing through an entire thickness of the gate insulating layer in a direction away from substrate.

* * * * *